(12) United States Patent
Dorhout et al.

(10) Patent No.: US 8,741,781 B2
(45) Date of Patent: Jun. 3, 2014

(54) METHODS OF FORMING SEMICONDUCTOR CONSTRUCTIONS

(75) Inventors: Justin B. Dorhout, Boise, ID (US);
Ranjan Khurana, Boise, ID (US);
David Swindler, Boise, ID (US);
Jianming Zhou, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 13/529,006

(22) Filed: Jun. 21, 2012

(65) Prior Publication Data

US 2013/0341795 A1  Dec. 26, 2013

(51) Int. Cl.
*H01L 21/461* (2006.01)

(52) U.S. Cl.
USPC ........... 438/736; 438/377; 438/717; 438/942; 257/E21.035; 257/E21.259; 216/13; 216/41; 216/51

(58) Field of Classification Search
None
See application file for complete search history.

(56) References Cited

U.S. PATENT DOCUMENTS

| | | | |
|---|---|---|---|
| 7,160,788 B2 | 1/2007 | Sandhu et al. | |
| 7,790,360 B2 | 9/2010 | Alapati et al. | |
| 7,863,669 B2 | 1/2011 | Kato | |
| 8,039,399 B2 | 10/2011 | Niroomand et al. | |
| 2007/0224819 A1* | 9/2007 | Sandhu | 438/689 |
| 2008/0213549 A1* | 9/2008 | Lee et al. | 428/195.1 |
| 2010/0144150 A1* | 6/2010 | Sills et al. | 438/694 |
| 2010/0173492 A1* | 7/2010 | Kim et al. | 438/689 |
| 2011/0129991 A1 | 6/2011 | Armstrong et al. | |
| 2011/0183269 A1 | 7/2011 | Zhu | |
| 2012/0007164 A1 | 1/2012 | Sugihara | |

* cited by examiner

*Primary Examiner* — Steven Loke
*Assistant Examiner* — Cuong B Nguyen
(74) *Attorney, Agent, or Firm* — Wells St. John P.S.

(57) ABSTRACT

Some embodiments include a semiconductor construction having a pair of lines extending primarily along a first direction, and having a pair of contacts between the lines. The contacts are spaced from one another by a lithographic dimension, and are spaced from the lines by sub-lithographic dimensions. Some embodiments include a method of forming a semiconductor construction. Features are formed over a base. Each feature has a first type sidewall and a second type sidewall. The features are spaced from one another by gaps. Some of the gaps are first type gaps between first type sidewalls, and others of the gaps are second type gaps between second type sidewalls. Masking material is formed to selectively fill the first type gaps relative to the second type gaps. Excess masking material is removed to leave a patterned mask. A pattern is transferred from the patterned mask into the base.

24 Claims, 9 Drawing Sheets

METHODS OF FORMING SEMICONDUCTOR CONSTRUCTIONS

TECHNICAL FIELD

Semiconductor constructions and methods of forming semiconductor constructions.

BACKGROUND

Lithographic processes, such as photolithography, are commonly utilized during semiconductor processing. Lithographic processes have minimum capable feature sizes, F, which are the smallest feature sizes that can be reasonably formed with the processes. For instance, photolithography may be limited by factors such as optics and radiation wavelength.

A continuing goal in semiconductor processing is to reduce the size of individual electronic components, and to thereby enable smaller and denser integrated circuitry. A concept commonly referred to as "pitch" can be used to quantify the density of an integrated circuit pattern. Pitch may be defined as the distance between an identical point in two neighboring features of a repeating pattern. Feature size limitations of a lithographic technique can set a minimum pitch that can be obtained from the lithographic technique.

Pitch multiplication, such as pitch-doubling, is a proposed method for extending the capabilities of lithographic techniques beyond their minimum pitches. Pitch multiplication may involve forming sub-lithographic features (i.e., features narrower than minimum lithographic resolution) by depositing a material to have a thickness which is less than that of the minimum capable lithographic feature size, F. The material may be anisotropically etched to form the sub-lithographic features. The sub-lithographic features may then be used for integrated circuit fabrication to create higher density circuit patterns than can be achieved with conventional lithographic processing.

Difficulties may be encountered in processing associated with formation and utilization of sub-lithographic features. It would therefore be desirable to develop new methods for forming and utilizing sub-lithographic features. It would also be desirable to develop new structures utilizing such new methods.

BRIEF DESCRIPTION OF THE DRAWINGS

FIGS. 7-9 are a top view and cross-sectional side views of a portion of a semiconductor construction at a process stage subsequent to that of FIGS. 5 and 6. FIGS. 8 and 9 are along the lines 8-8 and 9-9, respectively, of FIG. 7.

FIGS. 10-12 are a top view and cross-sectional side views of a portion of a semiconductor construction at a process stage subsequent to that of FIGS. 7-9. FIGS. 11 and 12 are along the lines 11-11 and 12-12, respectively, of FIG. 10.

FIGS. 13-15 are a top view and cross-sectional side views of a portion of a semiconductor construction at a process stage subsequent to that of FIGS. 10-12. FIGS. 14 and 15 are along the lines 14-14 and 15-15, respectively, of FIG. 13.

FIGS. 16-18 are a top view and cross-sectional side views of a portion of a semiconductor construction at a process stage subsequent to that of FIGS. 13-15. FIGS. 17 and 18 are along the lines 17-17 and 18-18, respectively, of FIG. 16.

FIGS. 19-21 are a top view and cross-sectional side views of a portion of a semiconductor construction at a process stage subsequent to that of FIGS. 16-18. FIGS. 20 and 21 are along the lines 20-20 and 21-21, respectively, of FIG. 19.

FIGS. 22-24 are a top view and cross-sectional side views of a portion of a semiconductor construction at a process stage subsequent to that of FIGS. 19-21. FIGS. 23 and 24 are along the lines 23-23 and 24-24, respectively, of FIG. 22.

DETAILED DESCRIPTION OF THE ILLUSTRATED EMBODIMENTS

Pitch-multiplication methodologies may form a masking pattern having sub-lithographic dimensions. In some applications, individual features of the masking pattern may be formed with an anisotropic etch. Such features may have one side which is substantially straight, and an opposing side having a rounded top corner. Some embodiments take advantage of the differences between the two sides of the features during subsequent deposition of masking material across the features, so that the masking material selectively fills some gaps between the features and leaves other gaps unfilled. Example embodiments are described with reference to FIGS. 1-27.

FIGS. 1-4 illustrate various process stages of an example pitch-multiplication process.

Figure 1:
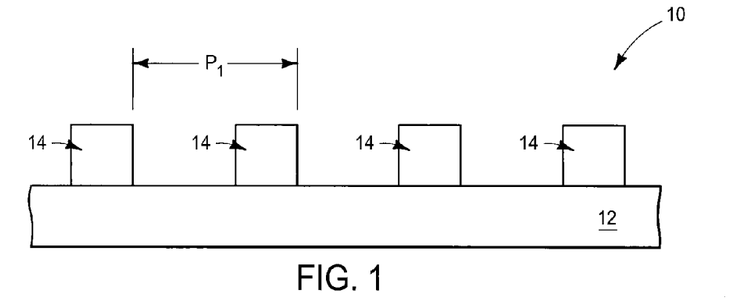
FIGS. 1-4 are diagrammatic, cross-sectional views of a portion of a semiconductor construction showing various process stages of an example embodiment method of forming sub-lithographically-spaced masking features through pitch-multiplication.

FIG. 1 shows a construction 10 comprising a base 12, and a plurality of lithographically-formed features 14 over the base. The features 14 are formed to a pitch $P_1$ having lithographic dimensions. For instance, in some embodiments the features 14 may have widths of at least about 50 nanometers, and the gaps between such features may have widths of at least about 50 nanometers; and accordingly the pitch $P_1$ may be at least about 100 nanometers. The gaps and features may have any suitable relationship regarding the widths of the gaps relative to the widths of the features. In the shown application, the gaps are wider than the features by a ratio of about 5:3. In some embodiments, the features 14 may be lines which extend in and out of the page relative to the cross-sectional view of FIG. 1.

The base 12 may comprise any suitable composition. In some embodiments, base 12 may comprise a semiconductor material. In such embodiments, base 12 may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous materials in some embodiments. For instance, base 12 may correspond to a semiconductor substrate containing one or more materials associated with integrated circuit fabrication. In such embodiments, such materials may correspond to one or more of semiconductor materials, refractory metal materials, barrier materials, diffusion materials, insulator materials, etc.

The features 14 may comprise any suitable composition. In some embodiments, features 14 may correspond to photolithographically-patterned photoresist.

Figure 2:
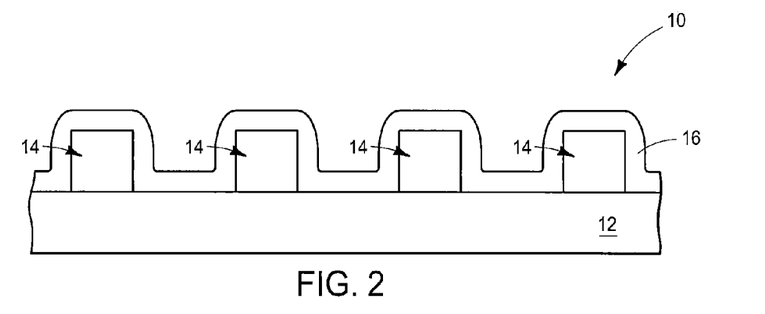

Referring to FIG. 2, a material 16 is deposited across base 12. The material 16 may comprise any suitable composition or combination of compositions; and in some embodiments may comprise, consist essentially of, or consist of one or both of silicon dioxide and silicon nitride. Material 16 may be deposited with any suitable methodology, including, for example, one or both of atomic layer deposition (ALD) and chemical vapor deposition (CVD). The material 16 has a sub-lithographic thickness; and in some embodiments may have a thickness of less than about 40 nanometers, less than or equal to about 30 nanometers, less than or equal to about 20 nanometers, etc. In some embodiments, material 16 may be considered to form a sheet which extends conformally across features 14 and the gaps between such features.

Figure 3:
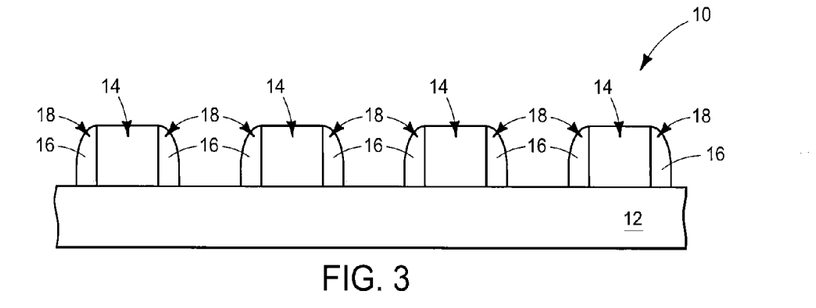

Referring to FIG. 3, material 16 is subjected to an anisotropic etch. Material 16 is thus converted into sub-lithographic features 18 along sidewalls of the features 14.

Figure 4:
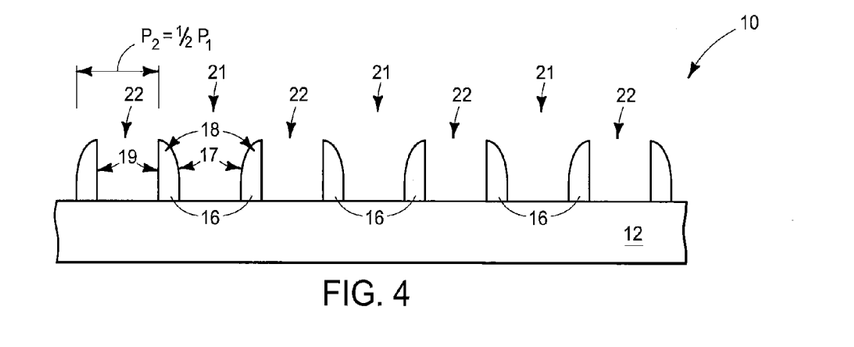

Referring to FIG. 4, features 14 (FIG. 3) are removed. The remaining sub-lithographic features 18 are at a pitch $P_2$, with $P_2$ being about half of $P_1$ in the shown embodiment. In other embodiments, pitch multiplication methodologies may be utilized to form pitches which are less than one-half of the initial lithographic pitch; such as, for example, pitches which are one-third of the initial lithographic pitch, one-quarter of the initial lithographic pitch, etc. In some embodiments, $P_2$ may be less than about 40 nanometers, less than or equal to about 30 nanometers, less than or equal to about 20 nanometers, etc.

The individual features 18 each comprise a pair of opposing sidewalls 17 and 19 (only some of which are labeled). The sidewalls 17 are a first type sidewall, and in the shown embodiment are distinguished by a rounded surface resulting from being exposed to the anisotropic etch discussed above with reference to FIG. 3. The sidewalls 19 are a second type sidewall, and in the shown embodiment are distinguished by a straight surface which had been directly adjacent the features 14 of FIG. 3.

Gaps 21 and 22 are between features 18. Gaps 21 are first type gaps, and are gaps between the first type sidewalls 17. Gaps 22 are second type gaps, and are gaps between the second type sidewalls 19. The terms "first type gap" and "second type gap" are used to indicate that the gaps 21 and 22 are different from one another, and there is no significance intended by the specific reference to gaps 21 as "first type gaps" and gaps 22 as "second type gaps." Thus, to the extent that the claims that follow refer to a construction having "first type gaps" and "second type gaps," the first type gaps may be any configuration different from the second type gaps; and in some embodiments may be analogous to either of the gaps 21 or 22. Similarly to the extent that the claims that follow refer to a construction comprising "second type gaps," the second type gaps may be any configuration different from the first type gaps; and in some embodiments may be analogous to either of the gaps 21 or 22.

Differences between the first and second type gaps 21 and 22 are subtle, and are commonly ignored in conventional processing. However, some embodiments described herein take advantage of the subtle difference between the first and second type gaps to achieve an additional level of masking. An example embodiment is described with reference to FIGS. 5-24.

Figure 5:
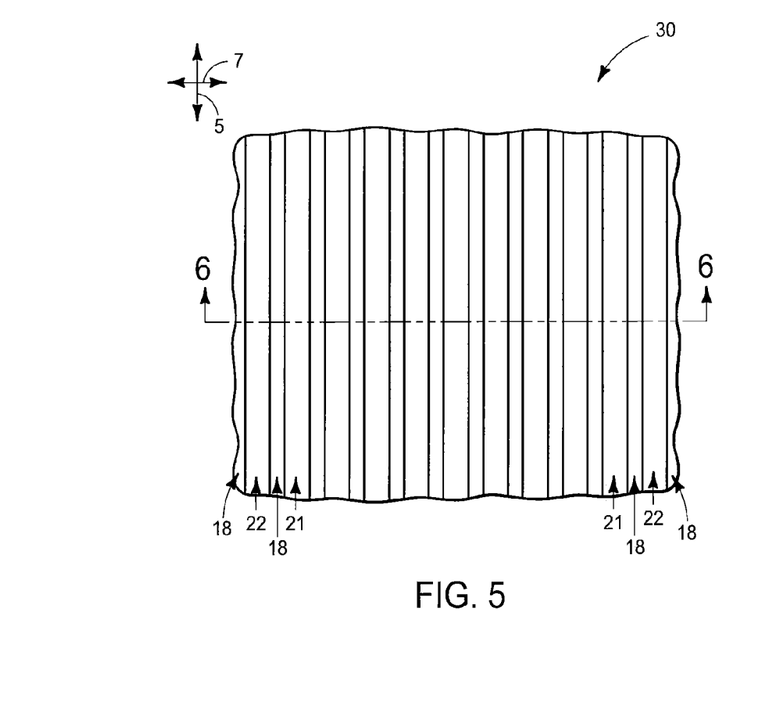
FIGS. 5 and 6 are a top view, and a cross-sectional side view of a portion of a semiconductor construction showing a process stage of an example embodiment method. The view of FIG. 6 is along the line 6-6 of FIG. 5.
Figure 6:
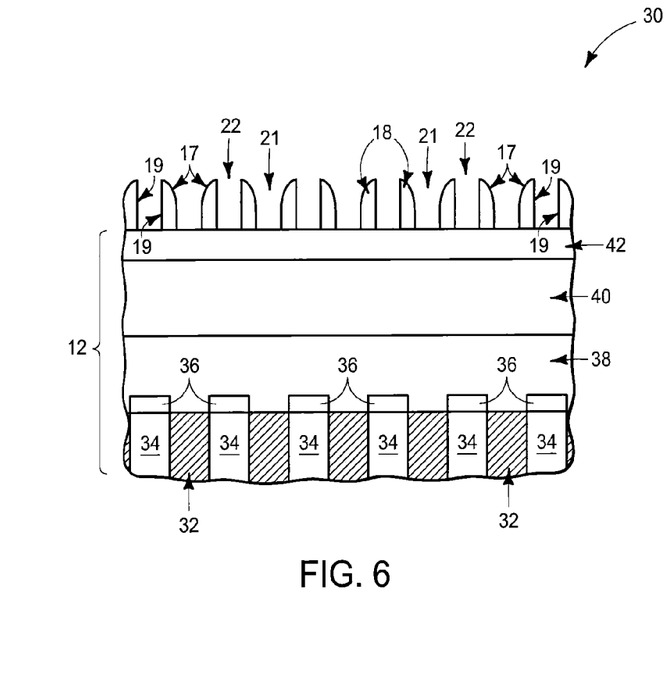

Referring to FIGS. 5 and 6, a construction 30 is shown in top view (FIG. 5) and cross-sectional side view (FIG. 6). The construction comprises sub-lithographic features 18 (only some of which are labeled) over a base 12. The features 18 may be formed utilizing processing analogous to that described above with reference to FIGS. 1-4, and accordingly may comprise anisotropically-etched material (for instance, anisotropically-etched silicon dioxide and/or silicon nitride). Each of the features comprises a first type sidewall 17 (only some of which are labeled) and a second type sidewall 19 (only some of which are labeled) in opposing relation to the first type sidewall; and the construction comprises first type gaps 21 (only some of which are labeled) between the first type sidewalls and second type gaps 22 (only some of which are labeled) between the second type sidewalls.

In the shown embodiment, the features 18 correspond to spaced-apart lines which extend primarily along a first direction of an axis 5 (shown in FIG. 5). Although the lines are shown to extend straight along axis 5, in other embodiments the lines may be curved or wavy configurations extending primarily along axis 5. The first and second type gaps 21 and 22 alternate with one another along a second direction indicated by an axis 7 (shown in FIG. 5), with the second direction of axis 7 being substantially orthogonal to the first direction of axis 5. The term "substantially orthogonal" is utilized to indicate that the directions 5 and 7 may be orthogonal to within reasonable tolerances of fabrication and measurement in some embodiments.

In the shown embodiment, the base 12 comprises spaced apart electrical nodes 32 (only some of which are labeled). The electrical nodes are along the bottom of the shown portion of the base, and in some embodiments may be referred to as being at a first level of the base. The nodes may be over an underlying semiconductor material, such as a monocrystalline silicon material, and accordingly may be part of a semiconductor construction in some embodiments. The nodes may comprise any suitable electrically conductive composition or combination of compositions; such as, for example, one or more of various metals (e.g., cobalt, tungsten, titanium, etc.), metal-containing compositions (e.g., metal silicide, metal nitride, cobalt silicide, etc.) and conductively-doped semiconductor materials (e.g., conductively-doped silicon, conductively-doped germanium, etc.).

The nodes 32 are spaced from one another by dielectric material 34. Such dielectric material may comprise any suitable composition or combination of compositions; such as, for example, at least one of silicon nitride, silicon dioxide, etc. The dielectric material 34 may be referred to as a first dielectric material.

Figure 24:
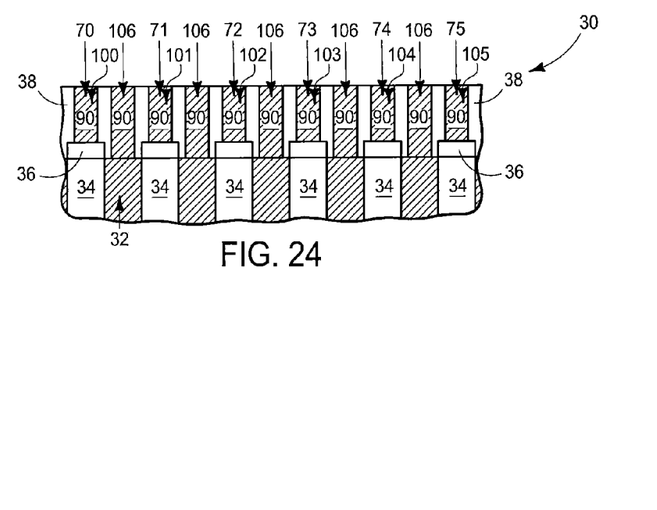

A second dielectric material 36 is over the first dielectric material, and such second dielectric material may be used to form landing pads for electrically conductive lines (as shown in FIG. 24). The second dielectric material may comprise any suitable electrically insulative composition or combination of compositions; and in some embodiments may comprise silicon nitride. The second dielectric material 36 may be a same composition as the first dielectric material 34 in some embodiments, and may be a different composition from the first dielectric material in other embodiments.

A first masking level 38 is over the nodes 32 and the dielectric materials 34 and 36. The first masking level may comprise any suitable composition or combination of compositions; and in some embodiments may comprise, consist essentially of, or consist of silicon dioxide.

A second masking level 40 is over the first masking level 38. The second masking level may comprise any suitable composition or combination of compositions; and in some embodiments may comprise, consist essentially of, or consist of carbon.

A third masking level 42 is over the second masking level 40. The third masking level may comprise any suitable composition or combination of compositions; and in some embodiments may comprise, consist essentially of or consist of silicon oxynitride—such as a deposited anti-reflective coating (DARC). In the shown embodiment, the features 18 are directly against the third masking level 42.

Figure 7:
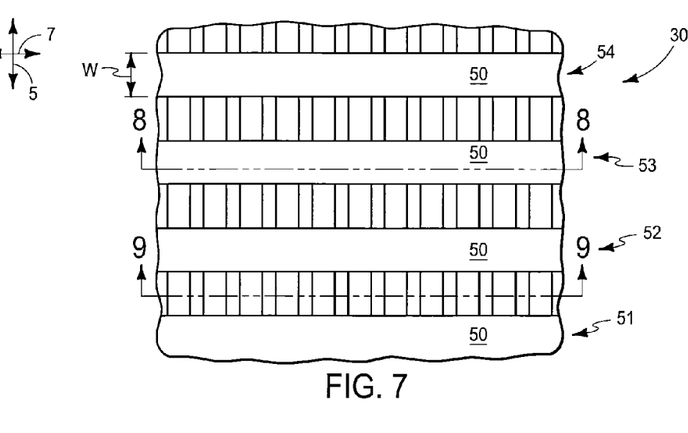
Figure 8:
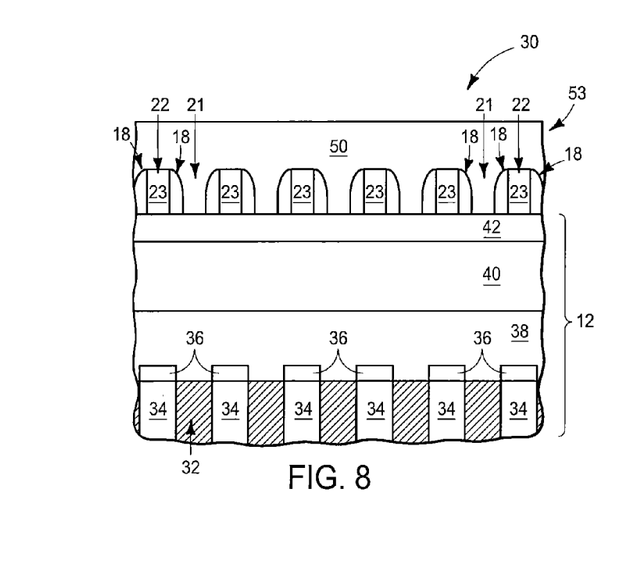
Figure 9:
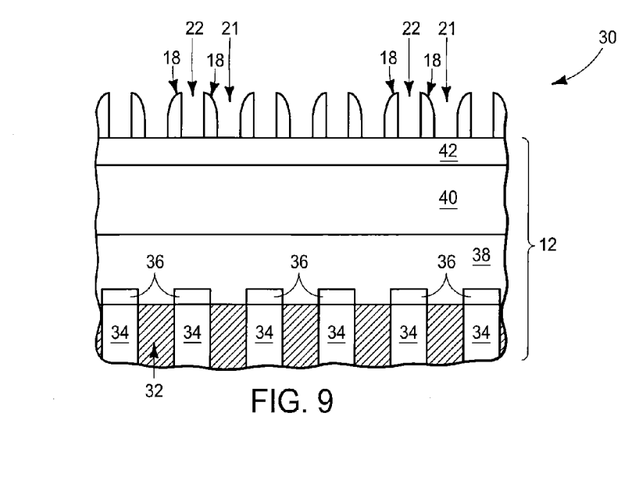

Referring to FIGS. 7-9, a patterned masking material 50 is formed over the features 18. In the shown embodiment, the patterned masking material is configured as stripes 51-54 that extend primarily along the direction of axis 7. The masking material is a lithographically-patterned material; such as, for example, photolithographically-patterned photoresist. Accordingly, the stripes 51-54 have widths (for instance, the width W of stripe 54) with lithographic dimensions. The term "lithographic dimension" means a dimension at least as large as a minimum capable lithographic feature size, F, of the process utilized to pattern masking material 50. In some embodiments, such widths may be at least about 50 nanometers.

The masking material 50 selectively fills the first type gaps 21 relative to the second type gaps 22; and in the shown embodiment spaces 23 remain in the second type gaps under the stripes of material 50. In some embodiments, the gaps 21 and 22 may be sub-lithographic and may comprise widths of less than about 40 nanometers, less than or equal to about 30 nanometers, or less than or equal to about 20 nanometers. In some embodiments, the masking material 50 may comprise photoresist. The photoresist may be initially provided as a composition having a molecular weight of at least about 6100 grams/mole and a viscosity of at least about 1.5 centipoise (for example, a viscosity within a range of from about 1.5 centipoise to about 1.7 centipoise), and then the photoresist may be photolithographically patterned to form the stripes 51-54. The photoresist having the above-described molecular weight and viscosity is found to selectively fill the first type gaps 21 relative to the second type gaps 22 in embodiments in which the first type gaps and second type gaps are sub-lithographic.

Although the masking material is shown to fill the first type gaps 21 selectively relative to the second type gaps 22, in other embodiments the masking material may selectively fill the second type gaps 22 relative to the first type gaps 21.

Figure 10:
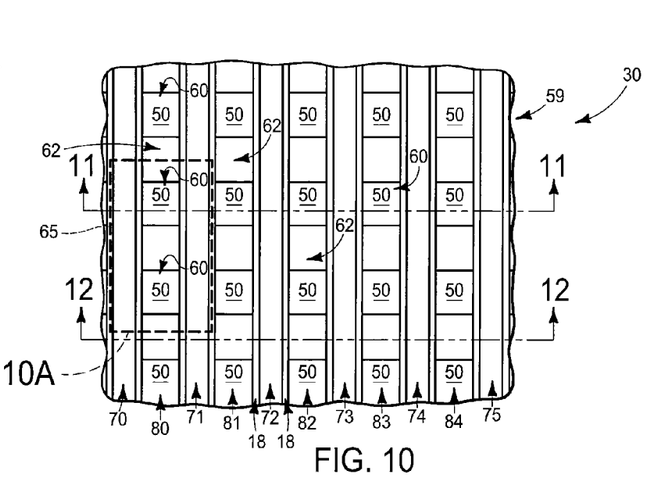
Figure 11:
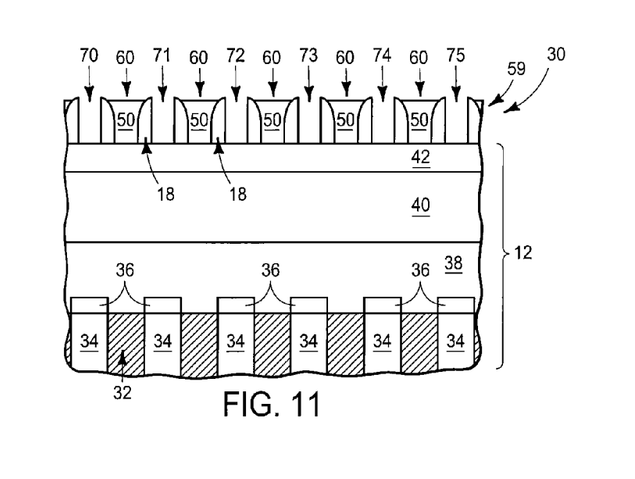
Figure 12:
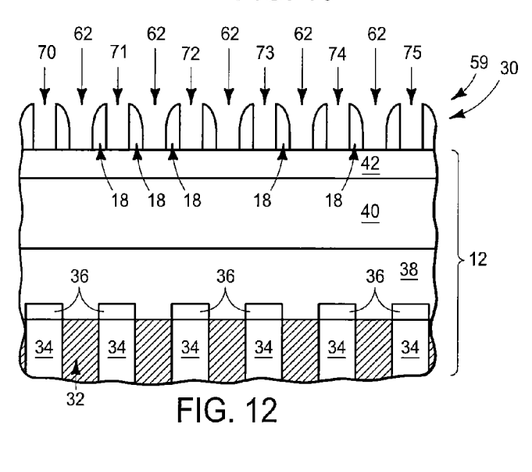

Any masking material outside of the first type gaps 21 in the embodiment of FIGS. 7-9 may be considered to be excess masking material, and may be removed with subsequent processing to form the construction shown in FIGS. 10-12. In embodiments in which the masking material 50 comprises photoresist, the processing utilized to remove the excess masking material may comprise, for example, an anisotropic descum.

The construction of FIGS. 10-12 may be considered to comprise a patterned mask comprising the linear features 18 in combination with remaining blocks of masking material 50. Such mask may be considered to define a component fabrication pattern 59, which may be utilized for fabricating integrated circuit components utilizing processing described below with reference to FIGS. 13-24.

In some embodiments, the component fabrication pattern 59 of FIGS. 10-12 may be considered to comprise line locations (or patterns) 70-75 where electrically conductive lines will be formed, and to comprise contact regions 80-84 which ultimately define locations for electrically conductive contacts. The contact regions comprise alternating blocking features 60 (only some of which are labeled) where masking material 50 bridges between adjacent lines 18, and comprise contact locations (or patterns) 62 (only some of which are labeled) where electrically conductive contacts will be formed.

Figure 10A:
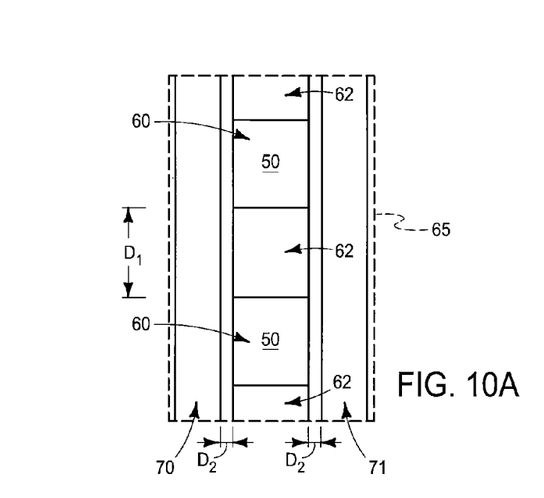
FIG. 10A is an expanded region of the construction of FIG. 10.

In some embodiments, the component fabrication pattern may be considered to comprise portions corresponding to the illustrated portion 65, which is shown in the top view of FIG. 10 and in an enlarged view in FIG. 10A. Such portion has a pair of line patterns 70 and 71 extending along a first direction of axis 5, and has a pair of contact patterns 60 between the line patterns. The contact patterns are spaced from one another by a lithographic dimension $D_1$ along the first direction of axis 5, and are spaced from the line patterns by sub-lithographic dimensions $D_2$ along the second direction of axis 7. In some embodiments, the lithographic dimension $D_1$ may be at least about three-times as large as the sub-lithographic dimensions $D_2$. In some embodiments, the sub-lithographic dimensions may be less than about 40 nanometers, less than or equal to about 30 nanometers, or less than or equal to about 20 nanometers.

Figure 13:
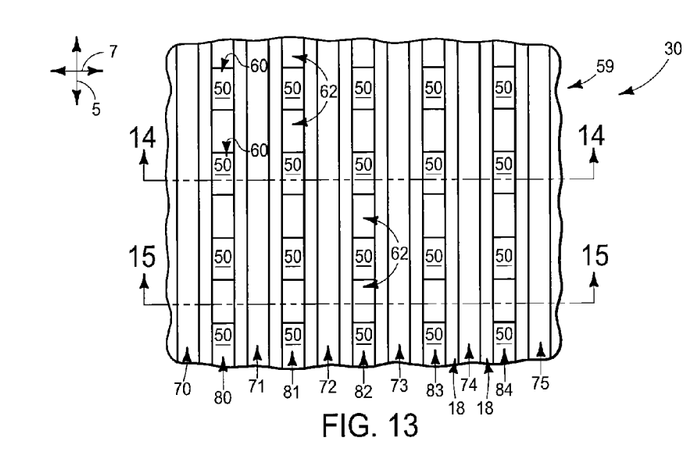
Figure 14:
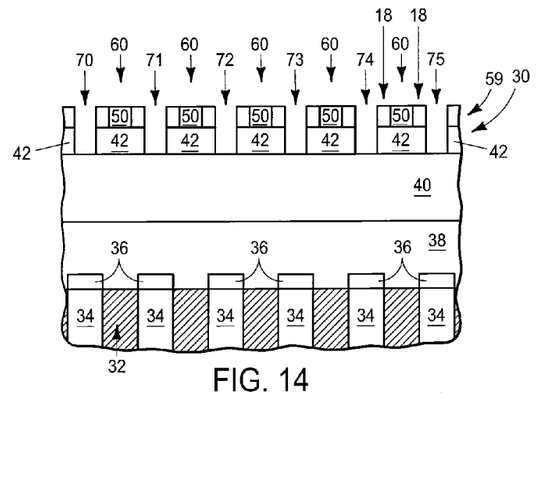
Figure 15:
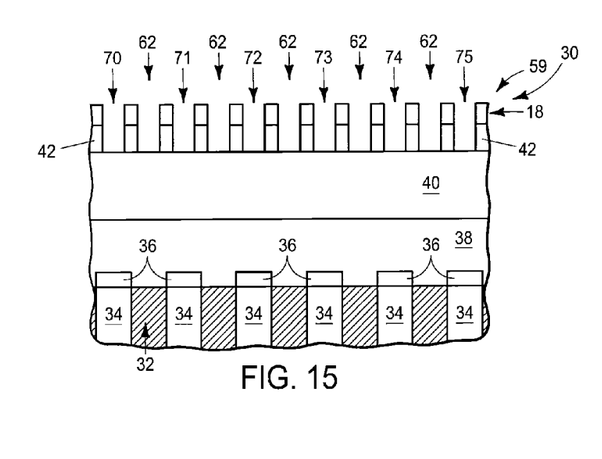
Figure 16:
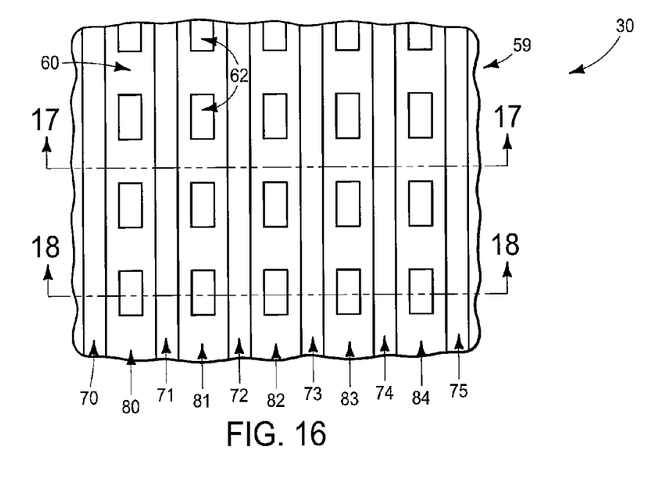
Figure 17:
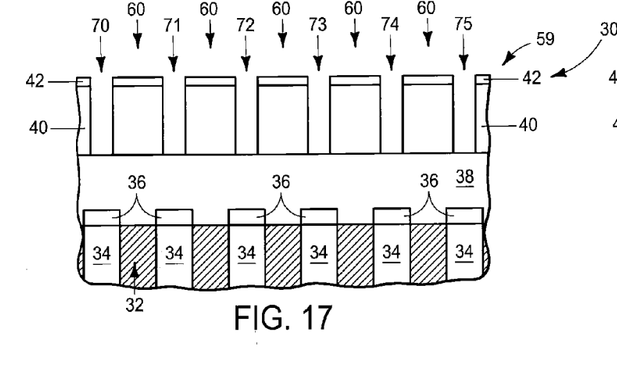
Figure 18:
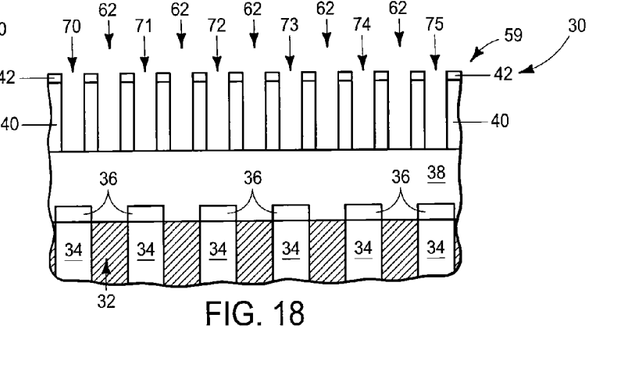
Figure 19:
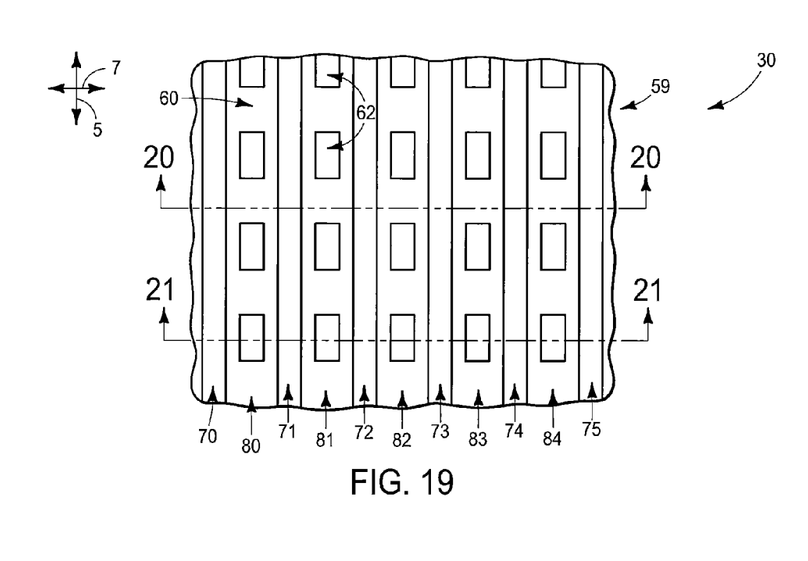
Figure 20:
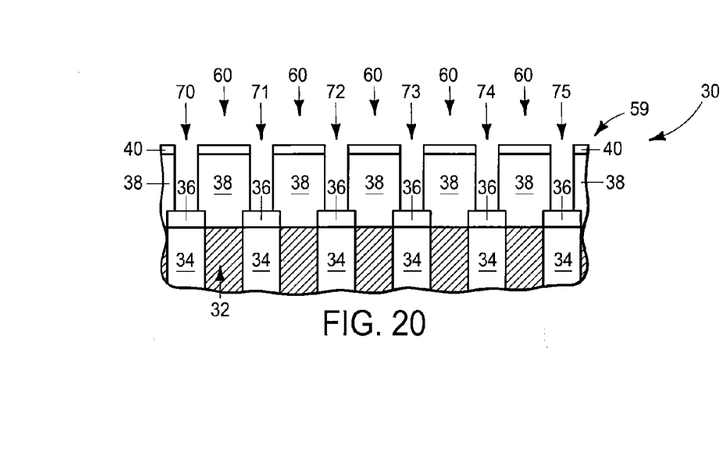
Figure 21:
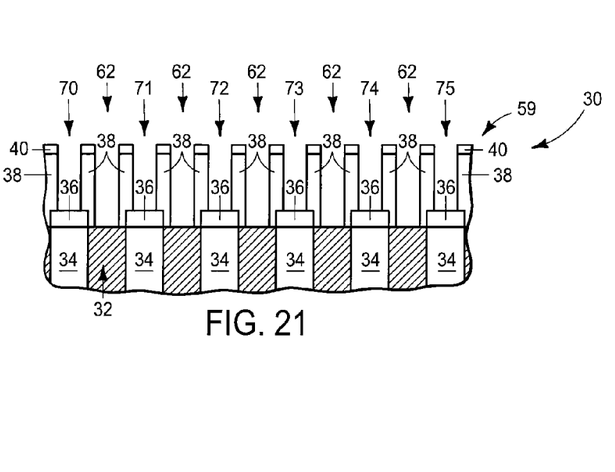

The component fabrication pattern 59 may be transferred into the base 12 with processing described with reference to FIGS. 13-21. FIGS. 13-15 illustrate that the component fabrication pattern 59 may be transferred into the third masking level 42 with one or more suitable etches. Such pattern may then be transferred from the third masking level into the second masking level 40 with one or more suitable etches as shown in FIGS. 16-18. Subsequently, the pattern 59 may be transferred from the second masking level to the first masking level 38 with one or more suitable etches as shown in FIGS. 19-21. The processing stage of FIGS. 19-21 has the line patterns 70-75 extending to the landing pads of dielectric material 36, has the contact patterns 62 forming contact openings extending to the electrical nodes 32, and has the blocking features 60 forming blocking regions between the contact openings along the direction of axis 5.

Figure 22:
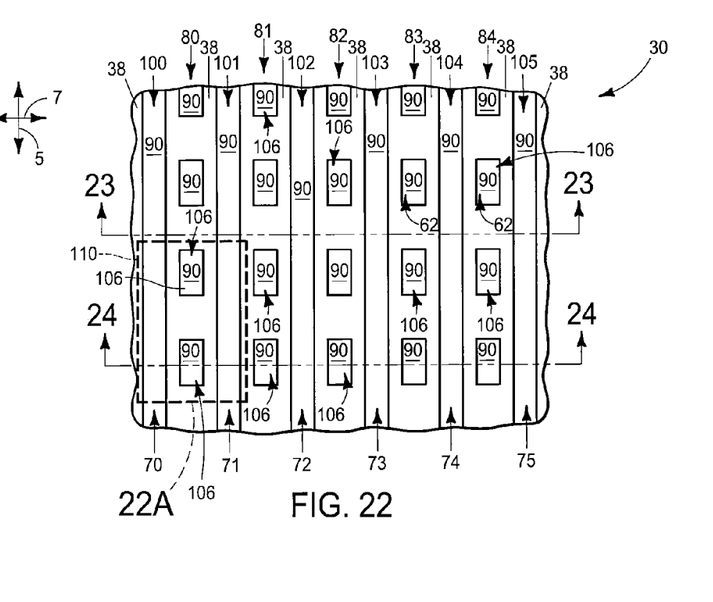
Figure 23:
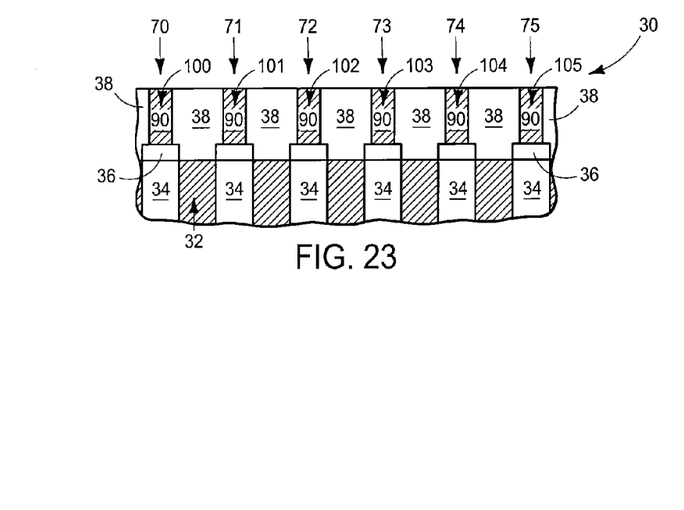

Referring to FIGS. 22-24, electrically conductive material 90 is formed within the line patterns 70-75 and contact openings 62. The electrically conductive material may comprise any suitable composition or combination of compositions; including, for example, one or more of various metals, metal-containing compositions and conductively-doped semiconductor materials. The electrically conductive material 90 may be formed within the line patterns and contact openings with any suitable processing. In some embodiments, the electrically conductive material is deposited to overfill the line patterns and contact openings, and subsequently chemical-mechanical polishing (CMP) is utilized to remove excess electrically conductive material and form the construction of FIGS. 22-24.

The electrically conductive material 90 within the line patterns 70-75 forms electrically conductive lines 100-105 across the landing pads of material 36, and forms contacts (i.e., conductive interconnects) 106 within the contact openings 62. The contacts 106 are directly over the electrically conductive nodes 32, and electrically coupled with such nodes.

Figure 22A:
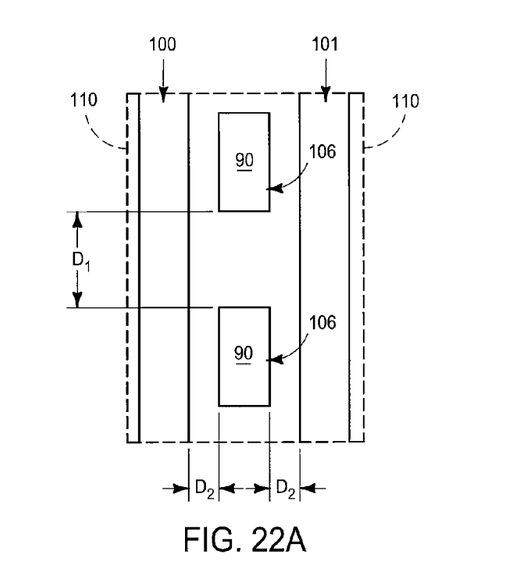
FIG. 22A is an expanded region of the construction of FIG. 22.

In some embodiments, the construction of FIGS. 22-23 may be considered to comprise portions corresponding to the illustrated portion 110, which is shown in enlarged view in FIG. 22A. Such portion has a pair of electrically conductive lines 100 and 101 extending along a first direction of axis 5, and has a pair of electrically conductive contacts 106 between the lines. The contacts are spaced from one another by a lithographic dimension $D_1$ along the first direction of axis 5, and are spaced from the line patterns by sub-lithographic dimensions $D_2$ along the second direction of axis 7. In some embodiments, the lithographic dimension $D_1$ may be at least about three-times as large as the sub-lithographic dimensions $D_2$. In some embodiments, the sub-lithographic dimensions may be less than about 40 nanometers, less than or equal to about 30 nanometers, or less than or equal to about 20 nanometers. In the shown embodiment, the lines 100 and 101 comprise the same material as the contacts 106. In other embodiments (not shown) the lines may comprise different materials than the contacts.

The top view of FIG. 22 shows that the electrically conductive contacts 106 may be considered to be arranged along lines 80-84. Individual lines have conductive material 90 alternating with dielectric material 38.

FIGS. 1-24 show embodiments in which the first and second type gaps 21 and 22 are about the same widths as one another. In other embodiments the gaps may have different widths relative to one another, as described with reference to FIGS. 25-27.

Figure 25:
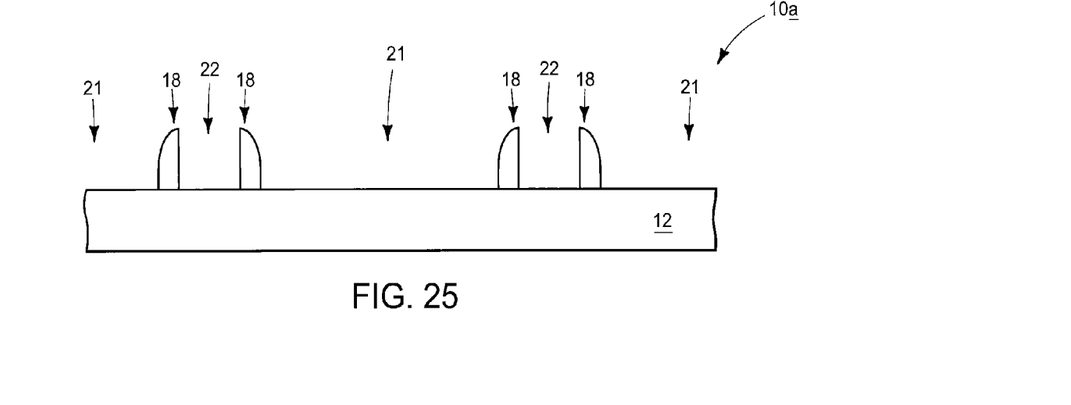
FIGS. 25-27 are diagrammatic cross-sectional views of a portion of a semiconductor construction at various process stages of another example embodiment method.

FIG. 25 shows a construction 10a at a processing stage analogous to the processing stage of FIG. 4. The construction comprises features 18 over base 12, and comprises the two types of gaps (or openings) 21 and 22 described above with reference to FIG. 4. However, unlike the embodiment of FIG. 4, that of FIG. 25 has different widths for the first type of gaps 21 than for the second type of gaps 22. Both types of gaps may have sub-lithographic widths in the embodiment of FIG. 25.

Figure 26:
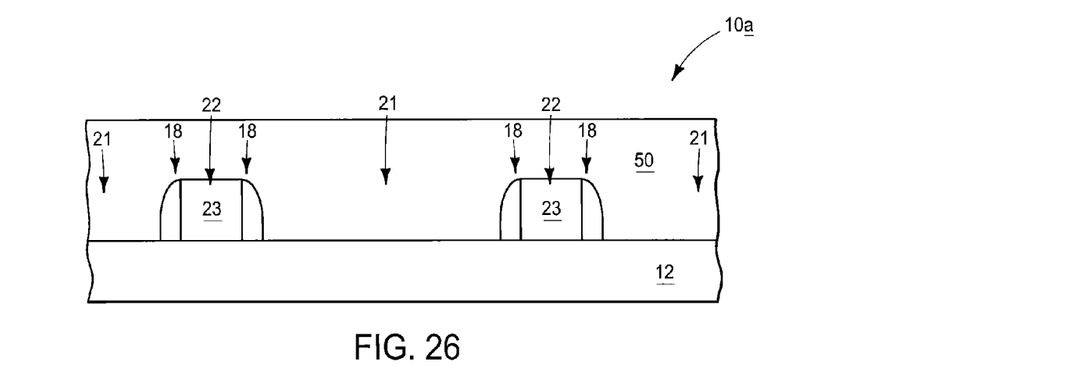

Referring to FIG. 26, masking material 50 is provided across construction 10a and fills the first type of gaps 21 while leaving the second type of gaps 22 unfilled. The unfilled gaps 22 are shown to comprise spaces 23.

In the shown embodiment, the masking material fills the wide gaps selectively relative to the narrow gaps. In other embodiments, the masking material may fill the narrow gaps selectively relative to the wide gaps.

Figure 27:
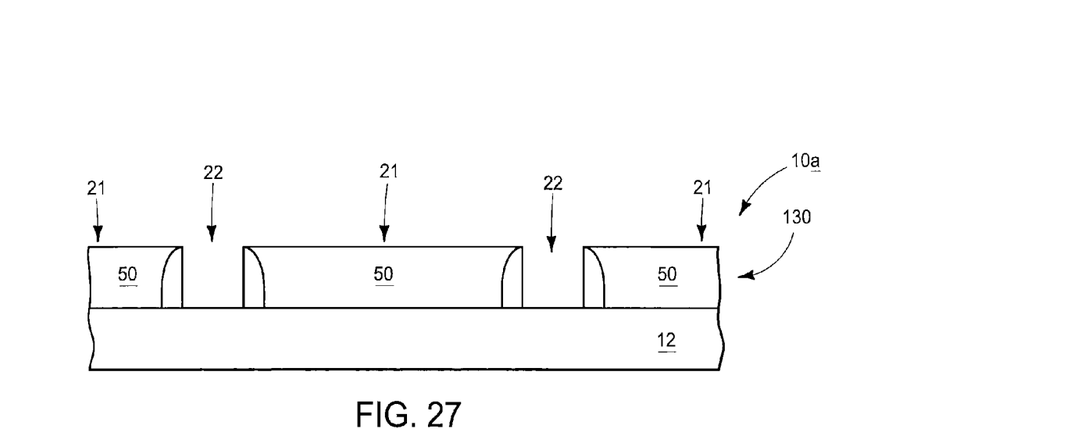

Referring to FIG. 27, excess masking material is removed to leave a patterned mask 130 over base 12, with patterned mask 130 comprising the masking material 50 only within the filled gaps 21. In subsequent processing, a pattern from mask 130 may be transferred into base 12. Such transferring of the pattern into base 12 may comprise one or more etches analogous to the etches described above with reference to FIGS. 13-21. Additionally, or alternatively, the pattern of mask 130 may be transferred into the underlying base by utilizing mask 130 to pattern a dopant implant.

The circuitry discussed above may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments a semiconductor construction comprises a pair of lines extending primarily along a first direction, and comprises a pair of contacts between the lines. The contacts are spaced from one another by a lithographic dimension along the first direction, and are spaced from the lines by sub-lithographic dimensions along a second direction substantially orthogonal to the first direction.

In some embodiments, a method of forming a semiconductor construction comprises forming a plurality of features over a base. Each feature has a pair of opposing sidewalls with one of the sidewalls being a first type and the other being a second type. The features are spaced from one another by gaps. Some of the gaps are first type gaps between first type sidewalls and others of the gaps are second type gaps between second type sidewalls. Masking material is formed over the features. The masking material selectively fills the first type gaps relative to the second type gaps. Masking material outside of the first type gaps is excess masking material. The excess masking material is removed to leave a patterned mask comprising the features in combination with the masking material in the first type gaps. A pattern is transferred from the patterned mask into one or more materials of the base.

In some embodiments, a method of forming a semiconductor construction comprises forming spaced-apart lines of anisotropically-etched material over a base. Each line comprises a pair of opposing sidewalls with one of the sidewalls being a first type and the other being a second type. The spaced-apart lines have gaps between them. Some of the gaps are first type gaps between first type sidewalls and others of the gaps are second type gaps between second type sidewalls. The lines extend primarily along a first direction. The first type gaps alternate with the second type gaps along a second direction substantially orthogonal to the first direction. Stripes of masking material are formed over the spaced-apart lines. The stripes extend primarily along the second direction. The masking material fills the first type gaps and does not fill the second type gaps. The masking material is removed from outside of the first type gaps, while leaving the masking material remaining within the first type gaps. The lines and the remaining masking material together form a component fabrication pattern. The component fabrication pattern is transferred into the base.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a semiconductor construction, comprising:

forming a plurality of features over a base, each feature having a pair of opposing sidewalls with one of the sidewalls being a first type and the other being a second type; the features being spaced from one another by gaps; some of the gaps being first type gaps between first type sidewalls and others of the gaps being second type gaps between second type sidewalls;

forming masking material over the features; the masking material selectively filling the first type gaps relative to the second type gaps; masking material outside of the first type gaps being excess masking material; the second gaps containing only empty spaces after forming the masking material, and the masking material extending over and entirely across such empty spaces;

removing the excess masking material to leave a patterned mask comprising the features in combination with the masking material in the first type gaps; and transferring a pattern from the patterned mask into one or more materials of the base.

2. The method of claim 1 wherein the first and second type gaps are less than about 40 nanometers wide; and wherein the masking material comprises photoresist having a molecular weight of at least about 6000 grams/mole and a viscosity of at least about 1.5 centipoise.

3. The method of claim 2 wherein the first and second type gaps are less than or equal to about 30 nanometers wide.

4. The method of claim 2 wherein the first and second type gaps are less than or equal to about 20 nanometers wide.

5. The method of claim 1 wherein the features comprise silicon dioxide or silicon nitride.

6. The method of claim 1 wherein the features are sub-lithographic features, and wherein the forming of the sub-lithographic features comprises:

forming photolithographically-patterned photoresist features over the base;

forming a sheet of material conformally across the photoresist features and gaps between the photoresist features;

anisotropically etching the sheet of material to form the sub-lithographic features from the sheet of material; the sub-lithographic features having one of the first and second type sidewalls against the photoresist of the photolithographically-patterned photoresist features, and having the other of the first and second type sidewalls along gaps between the photolithographically-patterned photoresist features; and removing the photolithographically-patterned photoresist features.

7. A method of forming a semiconductor construction, comprising:

forming spaced-apart lines of anisotropically-etched material over a base, each of the spaced-apart lines comprising a pair of opposing sidewalls with one of the sidewalls being a first type and the other being a second type; the spaced-apart lines having gaps between them; some of the gaps being first type gaps between first type sidewalls and others of the gaps being second type gaps between second type sidewalls; the spaced-apart lines extending primarily along a first direction; the first type gaps alternating with the second type gaps along a second direction substantially orthogonal to the first direction;

forming stripes of masking material over the spaced-apart lines, the stripes extending primarily along the second direction; the masking material filling the first type gaps and not filling the second type gaps;

removing any masking material outside of the first type gaps, while leaving the masking material remaining within the first type gaps; the spaced-apart lines and the remaining masking material together forming a component fabrication pattern; and transferring the component fabrication pattern into the base.

8. The method of claim 7 wherein the first type gaps are about a same width as the second type gaps.

9. The method of claim 7 wherein the first type gaps are different widths than the second type gaps.

10. The method of claim 9 wherein the first type gaps are narrower than the second type gaps.

11. The method of claim 9 wherein the first type gaps are wider than the second type gaps.

12. The method of claim 7 wherein the component fabrication pattern comprises blocking features corresponding to regions where the masking material is within the first type gaps and thereby bridges between adjacent lines, and comprises contact locations corresponding to regions of the first type gaps not containing masking material; and wherein the contact locations alternate with the blocking features along the first direction.

13. The method of claim 7 wherein the first and second type gaps are less than about 40 nanometers wide; and wherein the stripes of masking material are formed by photolithographically patterning a photoresist having a molecular weight of at least about 6000 grams/mole and a viscosity of at least about 1.5 centipoise.

14. The method of claim 7 wherein the spaced-apart lines are formed by anisotropically etching a sheet of material in a pitch-multiplication process.

15. The method of claim 14 wherein the sheet of material comprises silicon dioxide and/or silicon nitride.

16. The method of claim 7 wherein a portion of the component fabrication pattern comprises:

a pair of line patterns extending primarily along a first direction; and a pair of contact patterns between the line patterns; the contact patterns being spaced from one another by a lithographic dimension along the first direction, and being spaced from the line patterns by sub-lithographic dimensions along a second direction substantially orthogonal to the first direction.

17. The method of claim 16 wherein the lithographic dimension is at least about three-times as large as the sub-lithographic dimensions.

18. The method of claim 17 wherein the sub-lithographic dimensions are less than about 40 nanometers.

19. The method of claim 17 wherein the sub-lithographic dimensions are less than or equal to about 30 nanometers.

20. The method of claim 17 wherein the sub-lithographic dimensions are less than or equal to about 20 nanometers.

21. The method of claim 7 wherein:

the base comprises spaced-apart electrical nodes at a first level; first dielectric material between the spaced-apart electrical nodes; second dielectric material over the first dielectric material, with the second dielectric material forming landing pads for electrically conductive lines; a first masking level over the spaced-apart electrical nodes and second dielectric material; a second masking level over the first masking level; and a third masking level over the second masking level;

the spaced-apart lines are over and directly against the third masking level;

the transferring the component fabrication pattern into the base comprises a first etch to transfer the component fabrication pattern into the third masking level; a second etch to transfer the component fabrication pattern from the third masking level into the second masking level; and a third etch to transfer the component fabrication pattern from the second masking level into to the first masking level.

22. The method of claim 21 wherein the first dielectric material comprises silicon dioxide, the second dielectric material comprises silicon nitride, the first masking level comprises silicon dioxide, the second masking level comprises carbon and the third masking level comprises silicon oxynitride.

23. The method of claim 21 wherein the third etch forms line patterns across the landing pads of the second dielectric material and forms contact openings to the spaced-apart electrical nodes, and further comprising forming electrically conductive material within the line patterns and within the contact openings.

24. The method of claim 23 wherein the electrically conductive material overfills the line patterns and the contact openings, and further comprising polishing the electrically conductive material to remove overfill and leave lines within the line patterns and conductive contacts within the contact openings.

* * * * *

UNITED STATES PATENT AND TRADEMARK OFFICE
CERTIFICATE OF CORRECTION

| | |
|---|---|
| PATENT NO. | : 8,741,781 B2 |
| APPLICATION NO. | : 13/529006 |
| DATED | : June 3, 2014 |
| INVENTOR(S) | : Justin B. Dorhout et al. |

Page 1 of 1

It is certified that error appears in the above-identified patent and that said Letters Patent is hereby corrected as shown below:

In the Claims:

In column 11, line 7, in Claim 21, delete "into to" and insert -- into --, therefor.

Signed and Sealed this
Nineteenth Day of August, 2014

Michelle K. Lee
*Deputy Director of the United States Patent and Trademark Office*